(12) United States Patent
Onuma et al.

(10) Patent No.: US 10,084,119 B2
(45) Date of Patent: Sep. 25, 2018

(54) LIGHT-EMITTING DEVICE

(71) Applicant: SHARP KABUSHIKI KAISHA, Osaka-shi, Osaka (JP)

(72) Inventors: Hiroaki Onuma, Osaka (JP); Masataka Andou, Osaka (JP); Masatsugu Masuda, Osaka (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 205 days.

(21) Appl. No.: 14/899,748

(22) PCT Filed: Jun. 16, 2014

(86) PCT No.: PCT/JP2014/065846
§ 371 (c)(1),
(2) Date: Dec. 18, 2015

(87) PCT Pub. No.: WO2014/203841
PCT Pub. Date: Dec. 24, 2014

(65) Prior Publication Data
US 2016/0149095 A1    May 26, 2016

(30) Foreign Application Priority Data
Jun. 18, 2013  (JP) ................................ 2013-127554

(51) Int. Cl.
*H01L 33/50*  (2010.01)
*C09K 11/59*  (2006.01)
(Continued)

(52) U.S. Cl.
CPC ........ *H01L 33/504* (2013.01); *C09K 11/0883* (2013.01); *C09K 11/57* (2013.01);
(Continued)

(58) Field of Classification Search
CPC .............. H01L 33/504; C09K 11/7734; C09K 11/7774; C09K 11/57
See application file for complete search history.

(56) References Cited

U.S. PATENT DOCUMENTS 7,026,756 B2 * 4/2006 Shimizu ............. C09K 11/7767
                                            257/98
7,497,973 B2 * 3/2009 Radkov ................ C09K 11/675
                                            252/301.4 F (Continued)

FOREIGN PATENT DOCUMENTS

CN    101688115 A    3/2010
CN    101960624 A    1/2011
(Continued)

OTHER PUBLICATIONS

International Search Report for PCT/JP2014/065846, dated Aug. 12, 2014, 4 pages.

*Primary Examiner* — Carol M Koslow
(74) *Attorney, Agent, or Firm* — ScienBiziP, P.C.; Steve Reiss

(57) ABSTRACT

A light-emitting device (1) includes a substrate (2); a wiring pattern (3), an electrode land (4), a sealing resin layer (5), a wire (7), and a resin dam (9) that are disposed on the substrate (2); at least one light-emitting element (6) that emits light having a peak emission wavelength in a wavelength range of 430 to 480 nm; a green phosphor (10) that is excited by primary light emitted from the light-emitting element (6) to emit light having a peak emission wavelength in a green region; and a first red phosphor (11) that is excited by the primary light to emit light having a peak emission wavelength in a red region. The first red phosphor (11) emits no light in a wavelength range of 700 nm or more and absorbs no light in a wavelength range of 550 to 600 nm.

2 Claims, 4 Drawing Sheets

(51) Int. Cl.
   *C09K 11/64*   (2006.01)
   *C09K 11/80*   (2006.01)
   *C09K 11/57*   (2006.01)
   *C09K 11/08*   (2006.01)
   *C09K 11/77*   (2006.01)
   *H01L 33/32*   (2010.01)
   *H01L 33/56*   (2010.01)
   *H01L 25/075*  (2006.01)

(52) U.S. Cl.
   CPC ........ *C09K 11/646* (2013.01); *C09K 11/7721* (2013.01); *C09K 11/7734* (2013.01); *H01L 33/32* (2013.01); *H01L 33/56* (2013.01); *H01L 25/0753* (2013.01); *H01L 2224/48091* (2013.01); *H01L 2224/48137* (2013.01)

(56) References Cited

U.S. PATENT DOCUMENTS

| | | | |
|---|---|---|---|
| 8,237,348 B2* | 8/2012 | Masuda | C09K 11/0883 313/483 |
| 8,362,685 B2* | 1/2013 | Masuda | H01L 33/504 313/483 |
| 9,871,173 B2* | 1/2018 | Todorov | H01L 33/504 |
| 2006/0169998 A1 | 8/2006 | Radkov et al. | |
| 2010/0133563 A1* | 6/2010 | Schmidt | C09K 11/0883 257/98 |
| 2010/0176713 A1 | 7/2010 | Hanamoto et al. | |
| 2011/0043101 A1 | 2/2011 | Masuda et al. | |
| 2011/0176084 A1 | 7/2011 | Akiho et al. | |
| 2013/0241396 A1* | 9/2013 | Hiramatsu | H01L 33/504 313/503 |
| 2013/0257266 A1 | 10/2013 | Ishizaki | |
| 2015/0308657 A1 | 10/2015 | Liu et al. | |

FOREIGN PATENT DOCUMENTS

| | | | |
|---|---|---|---|
| CN | 02083941 A | | 6/2011 |
| CN | 102083941 | * | 6/2011 |
| CN | 102994079 A | | 3/2013 |
| JP | 2003-121838 | | 4/2003 |
| JP | 2010-196049 | | 9/2010 |
| JP | 2012-124356 | | 6/2012 |
| WO | WO 2009/110285 | | 9/2009 |
| WO | WO 2014/024138 | * | 2/2014 |

\* cited by examiner (a)

(b)

(a)

(b)

LIGHT-EMITTING DEVICE

This application is the U.S. national phase of International Application No. PCT/JP2014/065846 filed 16 Jun. 2014, which designated the U.S. and claims priority to JP Patent Application No. 2013-127554 filed 18 Jun. 2013, the entire contents of each of which are hereby incorporated by reference.

TECHNICAL FIELD

The present invention relates to light-emitting devices that can be used in applications such as light sources for lighting fixtures and displays, and particularly to a light-emitting device with good color rendering properties and high luminous efficiency.

BACKGROUND ART

Considerable efforts have been directed toward the research and development of light-emitting devices including semiconductor light-emitting elements in combination with phosphors. Such light-emitting devices are gaining attention as next-generation light-emitting devices having low power consumption, reduced size, and high luminance and capable of reproducing a wide range of colors. Semiconductor light-emitting elements typically emit primary light in the near-ultraviolet to blue region, for example, at wavelengths of 380 to 480 nm. Also proposed are light-emitting devices including various phosphors suited for different applications.

For example, such light-emitting devices are used as backlights for compact liquid crystal displays (LCDs). An example light-emitting device in this field is disclosed in Japanese Unexamined Patent Application Publication No. 2003-121838 (PTL 1). PTL 1 discloses a backlight light source having its spectral peak in the range of 505 to 535 nm. This backlight light source includes a green phosphor activated with europium, tungsten, tin, antimony, or manganese. Specifically, $MgGa_2O_4$:Mn and $Zn_2SiO_2$:Mn green phosphors are disclosed in the Examples in PTL 1. Unfortunately, these green phosphors exhibit noticeably low emission efficiency when excited by light having a peak wavelength of 430 to 480 nm (the primary light discussed above).

An example red phosphor is a tetravalent-manganese-activated tetravalent metal fluoride phosphor disclosed in U.S. Patent Application Publication No. 2006/0169998 (PTL 2). In PTL 2, however, there is no discussion of a light-emitting device in which semiconductor light-emitting elements are used in combination with phosphors in order to improve output performance.

Various semiconductor light-emitting devices for applications such as lighting systems have also been developed, and various approaches to improve output performance have been researched. For light-emitting devices that can be used as general lighting fixtures, good color rendering properties are an important performance factor along with improved output performance. (The term "good color rendering properties" basically means a general color rendering index Ra of 80 or more. Color rendering properties can be determined, for example, in accordance with the U.S. Energy Star Standards.) For example, Japanese Unexamined Patent Application Publication No. 2012-124356 (PTL 3) discloses a chip-on-board (COB) light-emitting device manufactured by directly mounting a plurality of light-emitting diode (LED) chips on a board, connecting the LED chips to a circuit via wiring lines on the board, and sealing the LED chips with resin. PTL 3 teaches that good color rendering properties can be achieved using two red phosphors of different peak wavelengths.

Unfortunately, a light-emitting device including only a $(Sr_{1-y},Ca_y)_{1-x}AlSiN_3$:$Eu_x$ phosphor (hereinafter referred to as "(Sr,Ca)AlSiN_3:Eu phosphor") and/or $Ca_{1-x}AlSiN_3$:$Eu_x$ (hereinafter referred to as "CaAlSiN_3:Eu phosphor"), which are used in PTL 3, may exhibit low luminous efficiency (in units of lm/W) relative to the power supplied thereto since most light components fall within a long-wavelength region of 700 nm or more (where the relative sensitivity of the human eye is low). The phosphors used in PTL 3, i.e., (Sr,Ca)AlSiN_3:Eu phosphors and CaAlSiN_3:Eu phosphors, also absorb secondary light emitted from green phosphors since they show light absorption at wavelengths of 500 to 600 nm, mainly in the green region. This results in two-step light emission in which the red phosphors emit light by absorbing secondary light emitted from green phosphors, thus leading to decreased emission efficiency.

The relative sensitivity of the eye is internationally defined by the relative sensitivity curve of the CIE (International Commission on Illumination) standard observer and is also defined in Japan as the spectral luminous efficiency in Appended Table 8 of Rules for Units of Measurement in Ordinance No. 189 of the Ministry of Economy, Trade and Industry. According to these standards, the human eye is most sensitive to light around a wavelength of 555 nm in bright light and is most sensitive to light around a wavelength of 507 nm in low light. The human eye is less sensitive to light at a wavelength longer or shorter than the peak wavelength and thus senses the light to be dimmer. The luminous efficiency for red light is lower at a longer wavelength.

CITATION LIST

Patent Literature

PTL 1: Japanese Unexamined Patent Application Publication No. 2003-121838

PTL 2: U.S. Patent Application Publication No. 2006/0169998

PTL 3: Japanese Unexamined Patent Application Publication No. 2012-124356

SUMMARY OF INVENTION

Technical Problem

In view of the foregoing problems, an object of the present invention is to provide a light-emitting device that includes a particular phosphor capable of efficiently emitting light in response to light (primary light emitted from light-emitting elements) at a wavelength of 430 to 480 nm and that has good color rendering properties and high luminous efficiency.

Solution to Problem

A light-emitting device according to the present invention includes a substrate; a wiring pattern, an electrode land, a sealing resin layer, a wire, and a resin dam that are disposed on the substrate; at least one light-emitting element that emits light having a peak emission wavelength in a wavelength range of 430 to 480 nm; a green phosphor that is excited by primary light emitted from the light-emitting element to emit light having a peak emission wavelength in a green region; and a first red phosphor that is excited by the primary light to emit light having a peak emission wavelength in a red region. The first red phosphor emits no light in a wavelength range of 700 nm or more and absorbs no light in a wavelength range of 550 to 600 nm.

The first red phosphor preferably contains at least one tetravalent-manganese-activated tetravalent metal fluoride phosphor represented by general formula (A): $(M1)_2((M2)_{1-h}Mn_h)F_6$ (where (M1) is at least one alkali metal element selected from the group consisting of Li, Na, K, Rb, and Cs; (M2) is at least one tetravalent metal element selected from the group consisting of Ge, Si, Sn, Ti, and Zr; and h satisfies $0.001 \leq h \leq 0.1$). In general formula (A), (M1) is preferably K, (M2) is preferably Si, and h preferably satisfies $0.005 \leq h \leq 0.05$.

The light-emitting device according to the present invention preferably further includes a second red phosphor. The second red phosphor preferably contains at least one of a (Sr,Ca)AlSiN$_3$:Eu phosphor, a CaAlSiN$_3$:Eu phosphor, and a divalent-europium-activated oxynitride phosphor represented by general formula (E): $(Eu_a(M7)_{1-a})_x Si_b Al_c O_d N_e$ (where x satisfies $0.15 \leq x \leq 1.5$; a satisfies $0 \leq a \leq 1$; b and c satisfy b+c=12; d and e satisfy d+e=16; and (M7) is at least one of Li, Na, K, Rb, Cs, Mg, Ca, Sr, Ba, Sc, Y, La, and Gd).

The green phosphor preferably contains at least one phosphor represented by general formula (B): $(M3)_{3-x}Ce_x(M4)_5O_{12}$ (where (M3) is at least one of Y, Lu, Gd, and La; (M4) is at least one of Al and Ga; and x satisfies $0.005 \leq x \leq 0.20$).

The light-emitting element is preferably an InGaN LED chip, and the light-emitting device preferably emits white light.

Advantageous Effects of Invention

The light-emitting device according to the present invention has good color rendering properties and high luminous efficiency.

DESCRIPTION OF EMBODIMENTS

Figure 1:
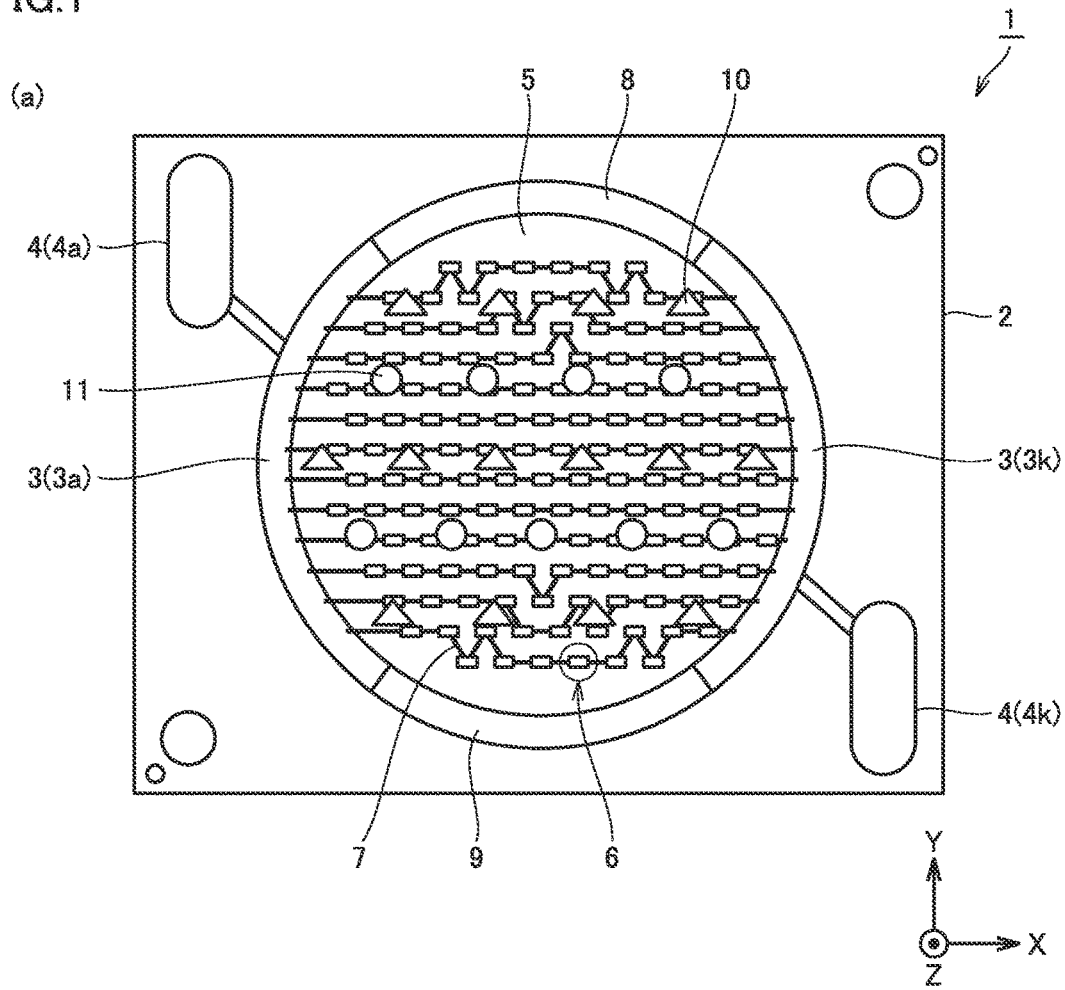
FIGS. 1(a) and 1(b) are a schematic plan view and a sectional view, respectively, of an example light-emitting device according to the present invention.
Figure 1:
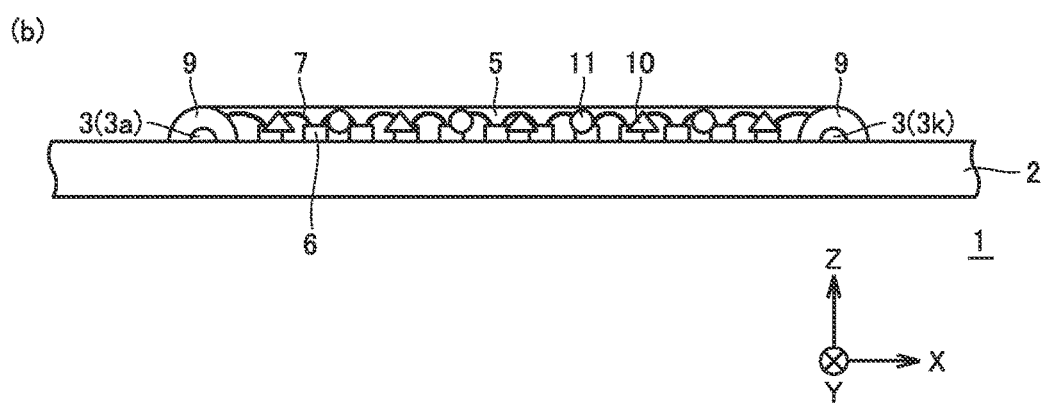

Light-emitting devices according to the present invention will now be described with reference to the drawings. In the drawings of the present invention, like reference numerals indicate like or corresponding parts. The dimensions, such as length, width, thickness, and depth, are altered for clarity and brevity of the drawings and are not drawn to scale.

First Embodiment

FIG. 1(a) is a schematic plan view of a light-emitting device according to a first embodiment of the present invention, and FIG. 1(b) is a partial sectional view taken along a plane extending across light-emitting elements 6 and wires 7 parallel to the XZ-plane. In FIG. 1(a), the inner part is shown as transparent for clarity of connections. As shown in FIGS. 1(a) and 1(b), a light-emitting device 1 according to this embodiment includes a ceramic substrate 2, wiring patterns 3 (3a and 3k), electrode lands 4 (4a and 4k), a sealing resin layer 5, light-emitting elements 6, wires 7, printed resistors 8, and a resin dam 9.

(Ceramic Substrate, Wiring Patterns, and Electrode Lands)

The ceramic substrate 2 is, for example, rectangular as viewed from the top of the light-emitting device 1 (hereinafter referred to as "in plan view"). The wiring patterns 3a and 3k are disposed opposite each other on the ceramic substrate 2 and are formed by a process such as screen printing. The wiring patterns 3a and 3k are each shaped to form part of a ring (i.e., arc-shaped) in plan view. The electrode lands 4a and 4k serve as electrodes for external connections (e.g., for power supply). The electrode lands 4a and 4k are made of a material such as Ag—Pt and are formed by a process such as screen printing. The electrode land 4a is connected to an end of the wiring pattern 3a via a lead, whereas the electrode land 4k is connected to an end of the wiring pattern 3k via another lead.

(Sealing Resin Layer)

The sealing resin layer 5 is made of a transparent resin in which a green phosphor 10 and a first red phosphor 11 are uniformly dispersed. The sealing resin layer 5 is disposed over the light-emitting elements 6 inside the resin dam 9, which is formed in an annular shape. The sealing resin layer 5 can be formed as follows. The green phosphor 10 and the first red phosphor 11 are uniformly mixed with a transparent resin. The resulting resin mixture is injected inside the resin dam 9, followed by heat treatment. By the heat treatment, the transparent resin is cured to seal the light-emitting elements 6, the green phosphor 10, and the first red phosphor 11.

The sealing resin layer 5 converts some of the primary light emitted from the light-emitting elements 6 (e.g., blue light) into green light and red light. In this way, the light-emitting device according to this embodiment emits a mixture of the primary light, the green light, and the red light, preferably white light. The green phosphor 10 and the first red phosphor 11 may be mixed in any proportion, preferably in a proportion that gives the desired characteristics.

The transparent resin present in the sealing resin layer 5 may be any resin capable of transmitting light, preferably a resin such as epoxy resin, silicone resin, or urea resin. The sealing resin layer 5 may contain additives such as SiO$_2$, TiO$_2$, ZrO$_2$, Al$_2$O$_3$, and Y$_2$O$_3$ in addition to the transparent resin, the green phosphor 10, and the first red phosphor 11. Such additives present in the sealing resin layer 5 are effective, for example, in preventing the phosphors such as the green phosphor 10 and the first red phosphor 11 from settling or in efficiently diffusing the light emitted from the light-emitting elements 6, the green phosphor 10, and the first red phosphor 11.

(First Red Phosphor)

The first red phosphor 11 is excited by the primary light emitted from the light-emitting elements 6 to emit light having a peak emission wavelength in the red region. The first red phosphor 11 emits no light in a wavelength range of 700 nm or more and absorbs no light in a wavelength range of 550 to 600 nm. By "the first red phosphor 11 emits no light in a wavelength range of 700 nm or more", it is meant that the emission intensity of the first red phosphor 11 in a wavelength range of 700 nm or more at a temperature of 300

K or higher is 1/100 or less of the emission intensity of the first red phosphor 11 at the peak emission wavelength. By "the first red phosphor 11 absorbs no light in a wavelength range of 550 to 600 nm", it is meant that the integral of the excitation spectrum of the first red phosphor 11 in a wavelength range of 550 to 600 nm at a temperature of 300 K or higher is 1/100 or less of the integral of the excitation spectrum of the first red phosphor 11 in a wavelength range of 430 to 480 nm. The wavelength of the excitation spectrum for measurement is the peak wavelength of the first red phosphor 11. The term "red region" as used herein refers to a region at wavelengths of 580 to less than 700 nm.

Figure 3:
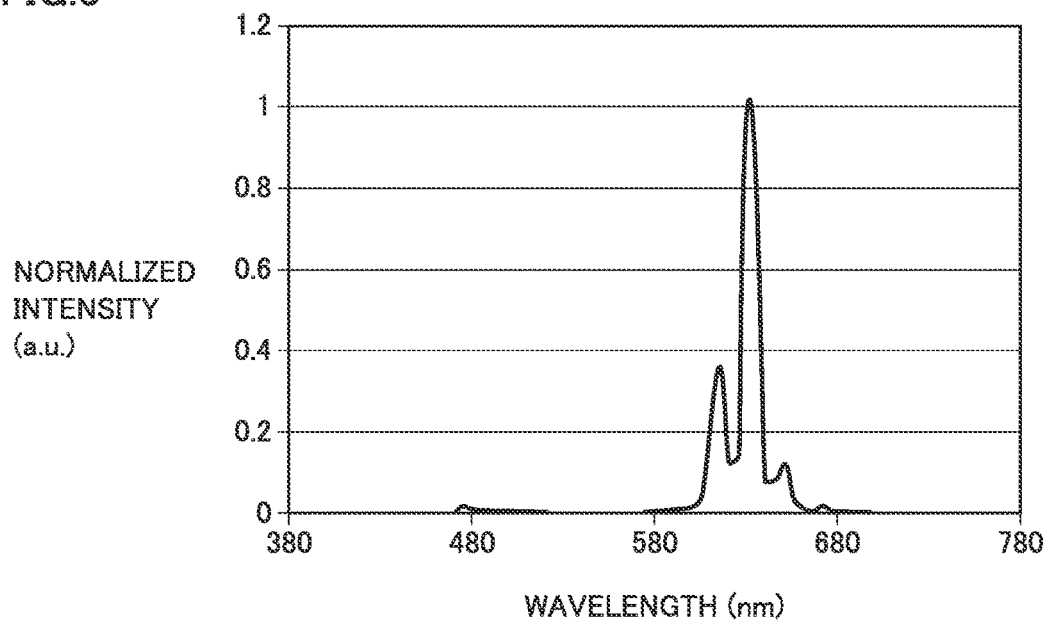
FIG. 3 is a graph showing the emission spectral distribution of an example first phosphor in the present invention.

FIG. 3 is a graph showing the emission spectral distribution of an example first red phosphor 11. In FIG. 3, the vertical axis represents normalized intensity (in arbitrary units), and the horizontal axis represents wavelength (nm). As can be seen from FIG. 3, the first red phosphor 11 emits little light in a long-wavelength region of 700 nm or more. The sensitivity of the human eye is relatively low in a long-wavelength region of 700 nm or more; therefore, it is very advantageous to use the first red phosphor 11 in light-emitting devices for applications such as lighting.

Since the first red phosphor 11 shows no light absorption in a wavelength range of 550 to 600 nm, it absorbs little secondary light emitted from green phosphors. This prevents two-step light emission in which the first red phosphor 11 emits light by absorbing secondary light emitted from green phosphors, thus maintaining high emission efficiency.

The first red phosphor 11 preferably contains, for example, at least one tetravalent-manganese-activated tetravalent metal fluoride phosphor represented by general formula (A): $(M1)_2 ((M2)_{1-h} Mn_h) F_6$. In general formula (A), Mn is manganese, and F is fluorine. In general formula (A), (M1) is at least one alkali metal element selected from the group consisting of Li, Na, K, Rb, and Cs, preferably K for reasons of brightness and stable powder characteristics. In general formula (A), (M2) is at least one tetravalent metal element selected from the group consisting of Ge, Si, Sn, Ti, and Zr, preferably Si for reasons of temperature characteristics. In general formula (A), h, which indicates the composition ratio (concentration) of Mn, satisfies $0.001 \leq h \leq 0.1$. If h is less than 0.001, the brightness may be insufficient. If h is more than 0.1, the brightness may decrease noticeably for reasons such as concentration quenching. More preferably, h satisfies $0.005 \leq h \leq 0.05$ for reasons of brightness and stable powder characteristics.

(Green Phosphor)

The green phosphor 10 is excited by the primary light emitted from the light-emitting elements 6 to emit light having a peak emission wavelength in the green region. The green phosphor 10 preferably contains at least one of a phosphor represented by general formula (B): $(M3)_{3-x} Ce_x (M4)_5 O_{12}$ (where (M3) is at least one of Y, Lu, Gd, and La; (M4) is at least one of Al and Ga; and x, which indicates the composition ratio (concentration) of Ce, satisfies $0.005 \leq x \leq 0.20$), a $Ca_3(Sc,Mg)_2Si_3O_{12}$:Ce phosphor, a divalent-europium-activated oxynitride phosphor that is a β-SiAlON represented by the general formula $Eu_a Si_b Al_c O_d N_e$ (where a satisfies $0.005 \leq a \leq 0.4$; b and c satisfy $b+c=12$; and d and e satisfy $d+e=16$), a divalent-europium-activated silicate phosphor represented by general formula (C): $(M5)_{2-x} Eu_x SiO_4$ (where (M5) is at least one of Mg, Ca, Sr, and Ba; and x, which indicates the composition ratio (concentration) of Eu, satisfies $0.03 \leq x \leq 0.10$), and a trivalent-cerium-activated phosphor represented by the formula $La_{3-x} Ce_x Si_6 N_{11}$ (where x satisfies $0.01 < x \leq 0.2$). The term "green region" refers to a region at wavelengths of 500 to 580 nm.

If a single green phosphor 10 is used (e.g., in applications such as lighting), the green phosphor 10 preferably shows a fluorescence spectrum having a large half-width, for example, 95 nm or more. Ce-activated phosphors, such as $Lu_{3-x} Ce_x Al_5 O_{12}$ green phosphors represented by general formula (B), have a garnet crystal structure. Since these phosphors are activated with Ce, they show a fluorescence spectrum having a large half-width (i.e., a half-width of 95 nm or more). Ce-activated phosphors thus serve as green phosphors suitable for achieving good color rendering properties.

(Light-Emitting Elements)

The light-emitting elements 6 emit light having a peak emission wavelength in a wavelength range of 430 to 480 nm. If the light-emitting elements 6 have a peak emission wavelength of less than 430 nm, the light-emitting device may be less practical since it has poor color rendering properties due to a low contribution of the blue light component to the light emitted from the light-emitting device. If the light-emitting elements 6 have a peak emission wavelength of more than 480 nm, the light-emitting device may be less practical. In particular, such a light-emitting device may be noticeably less practical if the light-emitting elements 6 are InGaN light-emitting elements, since the quantum efficiency decreases.

The LED chips used as the light-emitting elements 6 are preferably bare semiconductor light-emitting element chips that emit light containing a blue light component having a peak emission wavelength in the blue region (i.e., a region at wavelengths of 430 to 480 nm), more preferably InGaN LED chips. As an example, the light-emitting elements 6 may be LED chips having a peak emission wavelength around 450 nm. As used herein, the term "InGaN LED chip" refers to an LED chip including an InGaN light-emitting layer.

In this embodiment, the light-emitting elements 6 are attached to the ceramic substrate 2 by die bonding and are arranged in rows substantially parallel to one side of the ceramic substrate 2 (X-direction). The light-emitting elements 6 are arranged at high density in the area surrounded by the wiring patterns 3 and the printed resistors 8 such that the number of light-emitting elements 6 for each row is larger near the center of the ring formed by the wiring patterns 3 and the printed resistors 8 and becomes smaller from the center of the ring toward the periphery of the substrate (outward in the radial direction of the ring). In the example shown in FIG. 1, 12 light-emitting elements 6 are series-connected to form one string, and 12 strings are parallel-connected.

The light-emitting elements 6 are configured to emit light from the top thereof. The light-emitting elements 6 have thereon electrode pads (not shown, e.g., a cathode pad and an anode pad) for connecting the adjacent light-emitting elements 6 to each other via the wires 7 and for connecting the light-emitting elements 6 to the wiring patterns 3.

The light-emitting elements 6 may be configured to emit light from the bottom thereof. In this case, the light-emitting elements 6 are preferably mounted on the ceramic substrate 2 by forming wiring lines corresponding to the wires 7 and the electrode lands 4 on the ceramic substrate 2, positioning the electrode pads disposed on the light-emitting elements 6 opposite the top surface of the ceramic substrate 2, and bonding the light-emitting elements 6 to the ceramic substrate 2 with bumps therebetween by flip chip bonding.

(Printed Resistors)

The printed resistors 8 are intended to improve electrostatic resistance. As shown in FIG. 1, the printed resistors 8 are disposed so as to connect one end of the wiring pattern 3a to one end of the wiring pattern 3k and are shaped to form a part of a ring (i.e., arc-shaped).

The printed resistors 8 are preferably Zener diodes. The printed resistors 8 may be omitted from the light-emitting device 1 according to this embodiment.

(Resin Dam)

The resin dam 9 is a resin for stopping the sealing resin layer 5 from flowing and is made of a colored material (preferably white or milky white). As shown in FIGS. 1(a) and 1(b), the resin dam 9 is preferably formed so as to cover the ring formed by the wiring patterns 3 and the printed resistors 8.

As described above, the light-emitting device according to this embodiment emit light having an emission spectrum covering all three primary colors of light, i.e., blue, green, and red. The light-emitting device according to this embodiment also includes a first red phosphor that emits no light in a wavelength range of 700 nm or more and that absorbs no light in a wavelength range of 550 to 600 nm. This minimizes the emission of light in the region where the sensitivity of the eye is low and also prevents the first red phosphor 11 from absorbing the secondary light emitted from the green phosphor 10. The light-emitting device can therefore emit white light more efficiently.

Second Embodiment

FIG. 2(a) is a schematic plan view of a light-emitting device according to a second embodiment of the present invention, and FIG. 2(b) is a partial sectional view taken along a plane extending across light-emitting elements 6 and wires 7 parallel to the XZ-plane. In FIG. 2(a), the inner part is shown as transparent for clarity of connections.

The basic structure of the light-emitting device according to this embodiment is similar to that of the light-emitting device according to the first embodiment. However, the sealing resin layer 5 in this embodiment contains, as the first red phosphor 11, a tetravalent-manganese-activated tetravalent metal fluoride phosphor represented by general formula (A) above; as the green phosphor 10, at least one of a phosphor represented by general formula (B): $(M3)_{3-x}Ce_x(M4)_5O_{12}$, a $Ca_3(Sc,Mg)_2Si_3O_{12}$:Ce phosphor, a divalent-europium-activated oxynitride phosphor that is a β-SiAlON represented by the general formula $Eu_aSi_bAl_cO_dN_e$, a divalent-europium-activated silicate phosphor represented by general formula (C): $(M5)_{2-x}Eu_xSiO_4$, and a trivalent-cerium-activated phosphor represented by the formula $La_{3-x}Ce_xSi_6N_{11}$ (where x satisfies 0.01<x≤0.2); and at least one second red phosphor 12. The light-emitting device according to this embodiment thus contains two red phosphors. This allows the desired general color rendering index Ra to be easily selected from the range of general color rendering indices Ra of 80 or more. Light-emitting devices having such general color rendering indices Ra can be used as light sources for lighting to provide high-color-rendering lighting.

(Second Red Phosphor)

The second red phosphor 12 is excited by the primary light emitted from the light-emitting elements 6 to emit light having a peak emission wavelength in the red region. The second red phosphor 12 may be, for example, a (Sr,Ca)AlSiN$_3$:Eu phosphor or a CaAlSiN$_3$:Eu phosphor, described above, or may be a divalent-europium-activated nitride phosphor represented by general formula (D): $(M6)_{2-x}Eu_xSi_5N_8$ (where (M6) is at least one of Mg, Ca, Sr, and Ba; and x, which indicates the composition ratio (concentration) of Eu, satisfies 0.01≤x≤0.30) or a divalent-europium-activated oxynitride phosphor that is an α-SiAlON represented by general formula (E): $(Eu_a(M7)_{1-a})_xSi_bAl_cO_dN_e$ (where x satisfies 0.15≤x≤1.5; a satisfies 0≤a≤1; b and c satisfy b+c=12; d and e satisfy d+e=16; and (M7) is at least one of Li, Na, K, Rb, Cs, Mg, Ca, Sr, Ba, Sc, Y, La, and Gd).

The second red phosphor 12 preferably shows a fluorescence spectrum having a large half-width, as does the green phosphor 10. The second red phosphor 12 is preferably, for example, a (Sr,Ca)AlSiN$_3$:Eu phosphor or a CaAlSiN$_3$:Eu phosphor.

A single phosphor or a plurality of phosphors may be used as the second red phosphor 12. If a plurality of phosphors are used as the second red phosphor 12, the desired general color rendering index Ra can be more easily selected.

In this embodiment, the green phosphor 10, the first red phosphor 11, and the second red phosphor 12 may be mixed in any proportion, preferably in a proportion that gives the desired characteristics.

Whereas the light-emitting devices according to the first and second embodiments of the present invention have been described above, the light-emitting devices according to the present invention are not limited to the light-emitting devices according to the first and second embodiments. The properties (e.g., material, size, and shape) of the ceramic substrate 2, the wiring patterns 3, the electrode lands 4, the transparent resin in the sealing resin layer 5, the light-emitting elements 6, the wires 7, the printed resistors 8, and the resin dam 9 are not limited to those described above. The materials used as the green phosphor 10 and the second red phosphor 12 in the sealing resin layer 5 are not limited to those described above. The green phosphor 10, the first red phosphor 11, and the second red phosphor 12 may be manufactured by any process selected from known processes or may be obtained commercially.

EXAMPLES

The present invention is further illustrated by the following examples, although these examples are not intended to limit the present invention. In the examples below, white light-emitting devices were fabricated and evaluated for their characteristics.

Example 1

Figure 4:
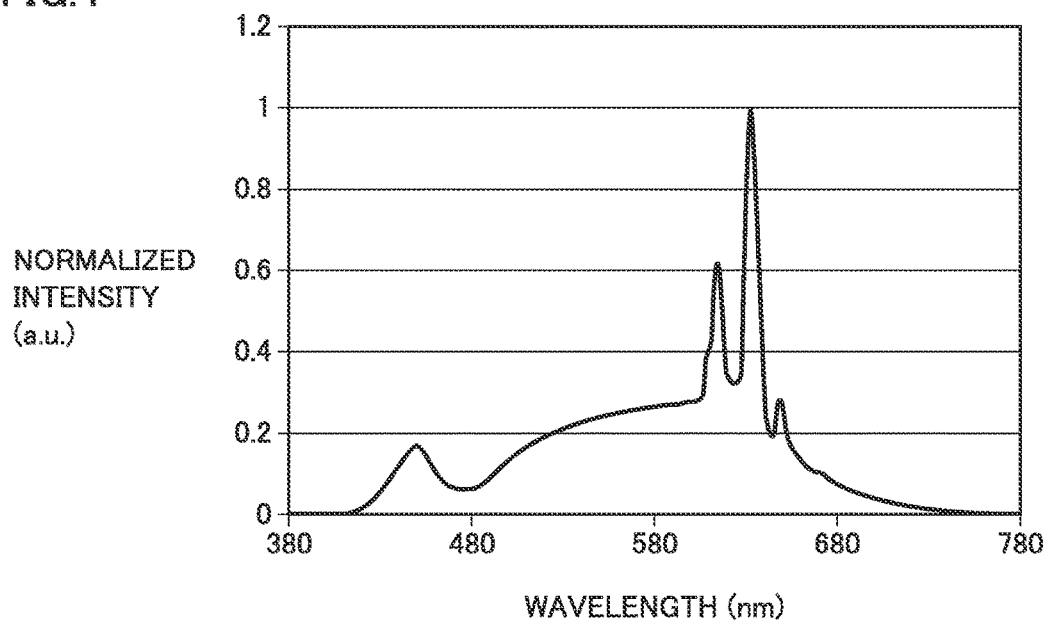
FIG. 4 is a graph showing the emission spectral distribution of a light-emitting device of Example 1.

A light-emitting device of Example 1 included a tetravalent-manganese-activated tetravalent metal fluoride phosphor (K$_2$SiF$_6$:Mn), a (Sr,Ca)AlSiN$_3$:Eu phosphor, and a CaAlSiN$_3$:Eu phosphor as red phosphors and a Lu$_{3-x}$Ce$_x$Al$_5$O$_{12}$ phosphor as a green phosphor. The results of the characteristic evaluation of the light-emitting device of Example 1 are summarized in FIG. 4 and Table 1. FIG. 4 is a graph showing the emission spectral distribution of the light-emitting device of Example 1. In FIG. 4, the vertical axis represents normalized intensity (in arbitrary units), and the horizontal axis represents wavelength (nm).

Comparative Example 1

A light-emitting device of Comparative Example 1 included only a CaAlSiN$_3$:Eu phosphor as a red phosphor and a Lu$_{3-x}$Ce$_x$Al$_5$O$_{12}$ phosphor as a green phosphor. The results of the characteristic evaluation of the light-emitting device of Comparative Example 1 are summarized in FIG.

Figure 5:
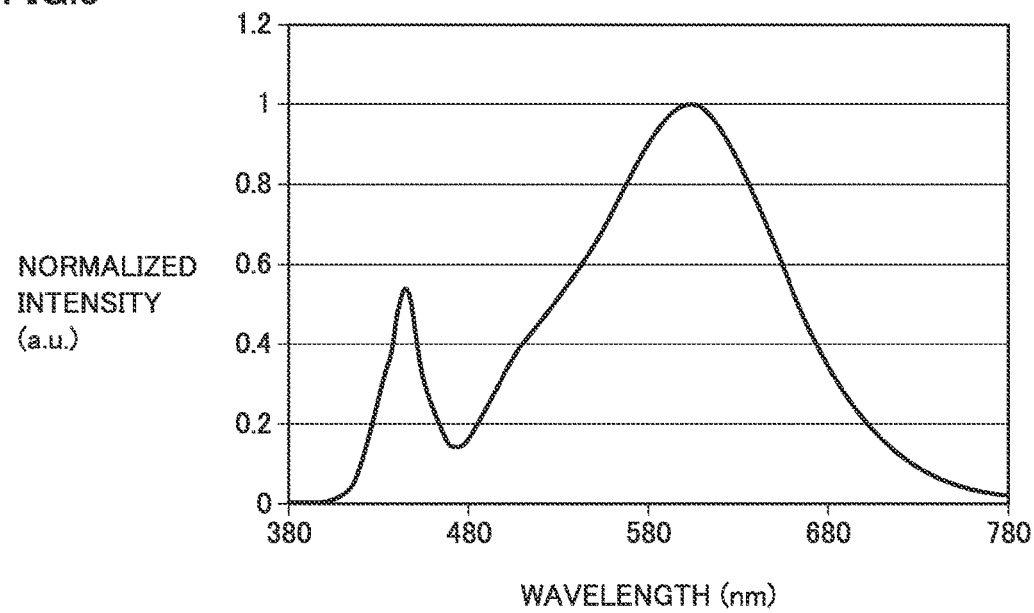
FIG. 5 is a graph showing the emission spectral distribution of a light-emitting device of Comparative Example 1.

5 and Table 1. FIG. 5 is a graph showing the emission spectral distribution of the light-emitting device of Comparative Example 1. In FIG. 5, the vertical axis represents normalized intensity (in arbitrary units), and the horizontal axis represents wavelength (nm).

Comparative Example 2

Figure 6:
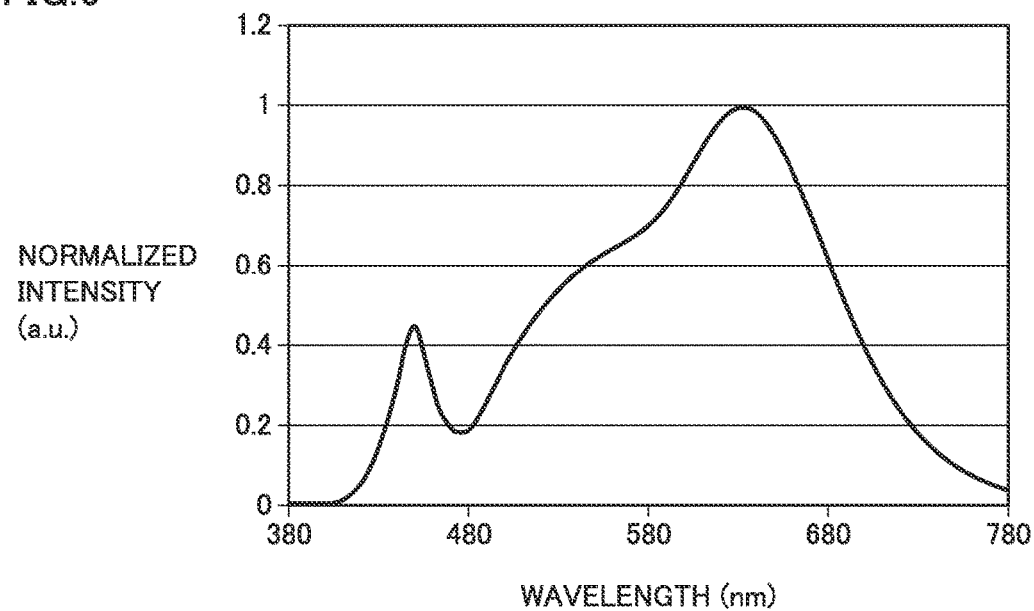
FIG. 6 is a graph showing the emission spectral distribution of a light-emitting device of Comparative Example 2.

A light-emitting device of Comparative Example 2 included a (Sr,Ca)AlSiN$_3$:Eu phosphor and a CaAlSiN$_3$:Eu phosphor as red phosphors and a Lu$_{3-x}$Ce$_x$Al$_5$O$_{12}$ phosphor as a green phosphor. The results of the characteristic evaluation of the light-emitting device of Comparative Example 2 are summarized in FIG. 6 and Table 1. FIG. 6 is a graph showing the emission spectral distribution of the light-emitting device of Comparative Example 2. In FIG. 6, the vertical axis represents normalized intensity (in arbitrary units), and the horizontal axis represents wavelength (nm).

where the sensitivity of the eye is low and also prevents the first red phosphor 11 from absorbing the secondary light emitted from the green phosphor 10.

The first red phosphor 11 preferably contains at least one tetravalent-manganese-activated tetravalent metal fluoride phosphor represented by general formula (A): (M1)$_2$((M2)$_{1-h}$Mn$_h$)F$_6$ (where (M1) is at least one alkali metal element selected from the group consisting of Li, Na, K, Rb, and Cs; (M2) is at least one tetravalent metal element selected from the group consisting of Ge, Si, Sn, Ti, and Zr; and h satisfies 0.001≤h≤0.1). In general formula (A), (M1) is preferably K, (M2) is preferably Si, and h preferably satisfies 0.005≤h≤0.05.

Figure 2:
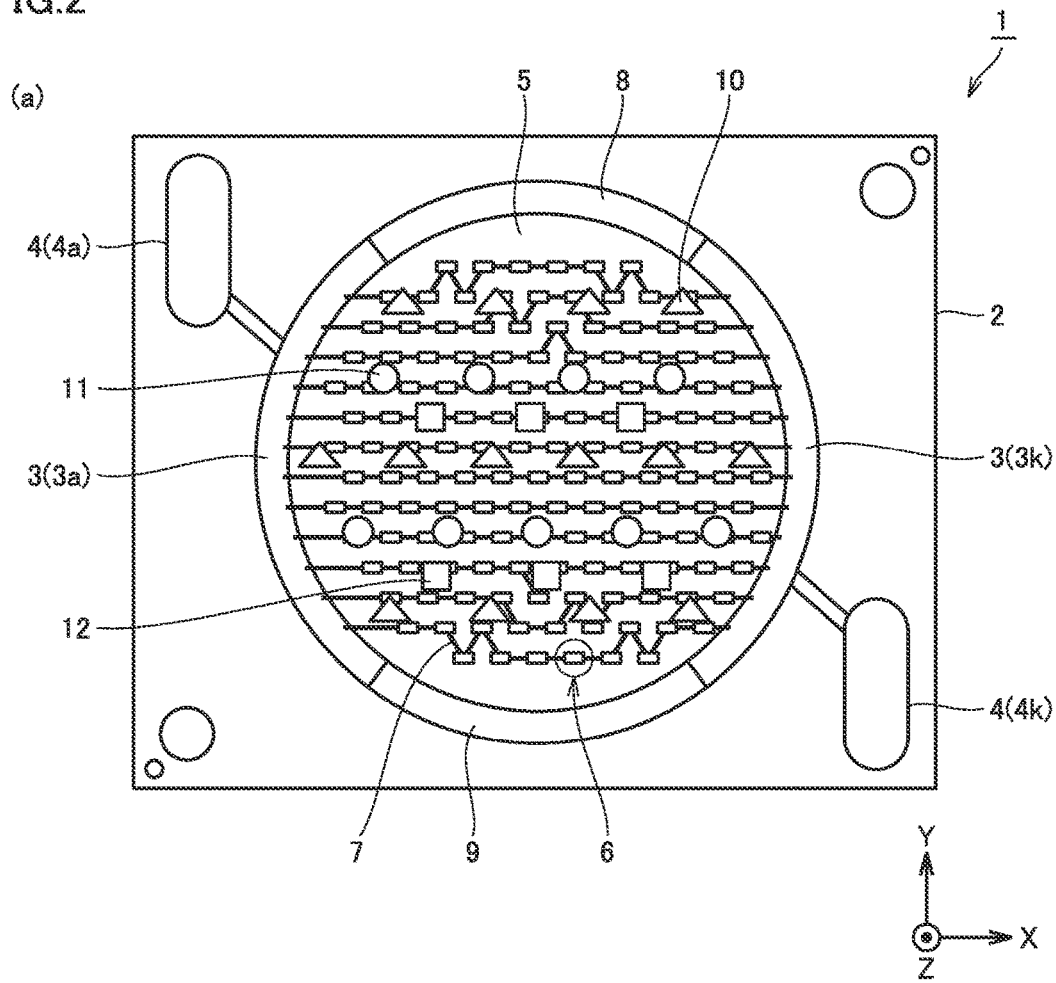
FIGS. 2(a) and 2(b) are a schematic plan view and a sectional view, respectively, of another example light-emitting device according to the present invention.
Figure 2:
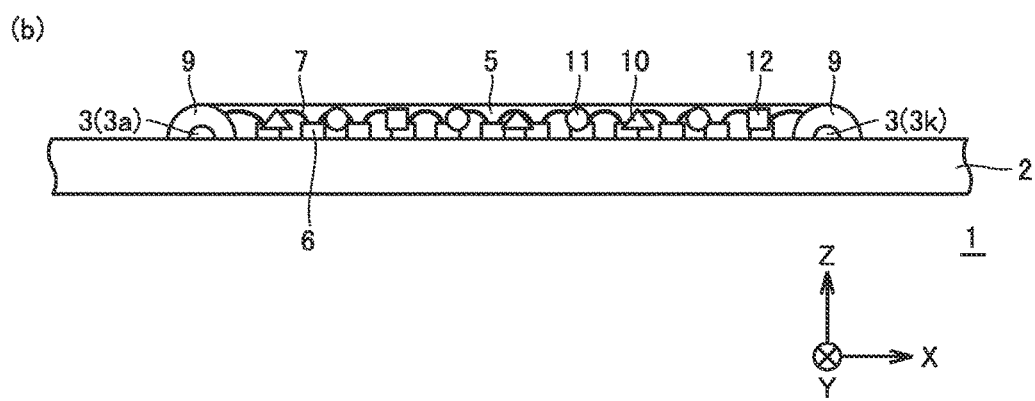

The light-emitting device 1 shown in FIG. 2 preferably further contains a second red phosphor 12 that is excited by the primary light to emit light having a peak emission wavelength in the red region. The second red phosphor 12 preferably contains at least one of a (Sr,Ca)AlSiN$_3$:Eu

TABLE 1

| | Red phosphor | | | Efficiency (lm/W) | Chromaticity x | Chromaticity y | Ra | R$_9$ |
|---|---|---|---|---|---|---|---|---|
| Comparative Example 1 | CaAlSiN$_3$:Eu | — | — | 76.4 | 0.4354 | 0.4002 | 95.9 | 84.6 |
| Comparative Example 2 | CaAlSiN$_3$:Eu | (Sr,Ca)AlSiN$_3$:Eu | — | 86.5 | 0.4360 | 0.4018 | 84.8 | 22.0 |
| Example 1 | CaAlSiN$_3$:Eu | (Sr,Ca)AlSiN$_3$:Eu | K$_2$SiF$_6$:Mn | 85.6 | 0.4388 | 0.3965 | 95.3 | 90.7 |

The efficiency (lm/W), the chromaticity x, the chromaticity y, the general color rendering index Ra, and the special color rendering index R$_9$ in Table 1 were measured using an integrating sphere available from Labsphere, Inc. and a spectrophotometer available from Otsuka Electronics Co., Ltd.

DISCUSSION

To compare luminous efficiency and color rendering properties, the contents of the phosphors in Example 1 and Comparative Examples 1 and 2 were adjusted so that they had similar chromaticity coordinates (x,y). As can be seen from Table 1, the emission efficiency of Example 1 was about 13% higher than that of Comparative Example 1 at nearly equal chromaticity coordinates (x,y) while the general color rendering index Ra was maintained, and the general color rendering index Ra and the special color rendering index R$_9$ (red) of Example 1 were noticeably higher than those of Comparative Example 2 while the emission efficiency was maintained.

Overview of Embodiments

The light-emitting devices 1 shown in FIGS. 1 and 2 include a substrate 2; wiring patterns 3, electrode lands 4, a sealing resin layer 5, wires 7, and a resin dam 9 that are disposed on the substrate 2; at least one light-emitting element 6 that emits light having a peak emission wavelength in a wavelength range of 430 to 480 nm; a green phosphor 10 that is excited by primary light emitted from the light-emitting element to emit light having a peak emission wavelength in the green region; and a first red phosphor 11 that is excited by the primary light to emit light having a peak emission wavelength in the red region. The first red phosphor 11 emits no light in a wavelength range of 700 nm or more and absorbs no light in a wavelength range of 550 to 600 nm. This minimizes the emission of light in the region phosphor, a CaAlSiN$_3$:Eu phosphor, and a divalent-europium-activated oxynitride phosphor represented by general formula (E): (Eu$_a$(M7)$_{1-a}$)$_x$Si$_b$Al$_c$O$_d$N$_e$ (where x satisfies 0.15≤x≤1.5; a satisfies 0≤a≤1; b and c satisfy b+c=12; d and e satisfy d+e=16; and (M7) is at least one of Li, Na, K, Rb, Cs, Mg, Ca, Sr, Ba, Sc, Y, La, and Gd). This allows the desired general color rendering index Ra to be easily selected from the range of general color rendering indices Ra of 80 or more. Light-emitting devices having such general color rendering indices Ra can be used as light sources for lighting to provide high-color-rendering lighting.

The green phosphor 10 preferably contains at least one phosphor represented by general formula (B): (M3)$_{3-x}$Ce$_x$(M4)$_5$O$_{12}$ (where (M3) is at least one of Y, Lu, Gd, and La; (M4) is at least one of Al and Ga; and x satisfies 0.005≤x≤0.20). This provides a light-emitting device with good color rendering properties.

The light-emitting elements 6 are preferably InGaN LED chips. The light-emitting device 1 preferably emits white light.

The present invention is not limited to the embodiments described above; various modifications are possible within the scope defined by the claims, and embodiments having suitable combinations of technical means disclosed in different embodiments are also included in the technical scope of the present invention.

REFERENCE SIGNS LIST 1 light-emitting device
2 ceramic substrate
3, 3a, 3k wiring pattern
4, 4a, 4k electrode land
5 sealing resin layer
6 light-emitting element
7 wire
8 printed resistor
9 resin dam 10 green phosphor
11 first red phosphor
12 second red phosphor

The invention claimed is:

1. A light-emitting device comprising:
at least one light-emitting element; and
a sealing resin layer covering the light-emitting element, the sealing resin layer comprising a green phosphor and a first red phosphor, wherein
the light-emitting element emits light having a peak emission wavelength in a wavelength range of 430 to 480 nm,
the green phosphor is excited by primary light emitted from the light-emitting element to emit light having a peak emission wavelength in a green region that is a wavelength range of 500 to 580 nm,
the first red phosphor is excited by the primary light to emit light having a peak emission wavelength in a red region,
the first red phosphor emits no light in a wavelength range of 700 nm or more and absorbs no light in a wavelength range of 550 to 600 nm, and
further comprising a second red phosphor that is excited by the primary light to emit light having a peak emission wavelength in a red region, wherein
the second red phosphor comprises at least two different types of phosphors selected from the group consisting of (i) a $(Sr,Ca)AlSiN_3$:Eu phosphor, (ii) a $CaAlSiN_3$:Eu phosphor, and (iii) a divalent-europium-activated oxynitride phosphor represented by general formula (E): $(Eu_a(M7)_{1-a})_x Si_b Al_c O_d N_e$ (wherein x satisfies $0.15 \leq x \leq 1.5$; a satisfies $0 \leq a \leq 1$; b and c satisfy $b+c=12$; d and e satisfy $d+e=16$; and (M7) is at least one of Li, Na, K, Rb, Cs, Mg, Ca, Sr, Ba, Sc, Y, La, and Gd), wherein
the light-emitting element is an InGaN LED chip,
the light-emitting device emits white light,
wherein the first red phosphor comprises at least one tetravalent-manganese-activated tetravalent metal fluoride phosphor represented by general formula (A): $(M1)_2((M2_{1-h}Mn_h)F_6$ (wherein (M1) is at least one alkali metal element selected from the group consisting of Li, Na, K, Rb, and Cs; (M2) is at least one tetravalent metal element selected from the group consisting of Ge, Si, Sn, Ti, and Zr; and h satisfies $0.001 \leq h \leq 0.1$), and
wherein the green phosphor comprises at least one phosphor represented by general formula (B): $(M3)_{3-x}Ce_x(M4)_5O_{12}$ (wherein (M3) is at least one of Y, Lu, Gd, and La; (M4) is at least one of Al and Ga; and x satisfies $0.005 \leq x \leq 0.20$).

2. The light-emitting device according to claim 1, wherein, in general formula (A), (M1) is K, and (M2) is Si.

* * * * *